United States Patent
Clement et al.

(10) Patent No.: US 7,079,068 B2
(45) Date of Patent: Jul. 18, 2006

(54) ANALOG TO DIGITAL CONVERTER

(75) Inventors: Patrick Clement, Bussigny (CH); Laurent Loup, Lausanne (CH); Abdessalem Turki, Geneva (CH)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/851,608

(22) Filed: May 21, 2004

(65) Prior Publication Data

US 2004/0233091 A1   Nov. 25, 2004

(30) Foreign Application Priority Data

May 23, 2003  (GB)  ................ 0311992.2

(51) Int. Cl.
*H03M 1/12* (2006.01)
(52) U.S. Cl. ...................... 341/155; 341/143
(58) Field of Classification Search ........... 341/143, 341/155; 708/313; 330/129; 331/1 A; 375/244, 375/216, 300
See application file for complete search history.

(56) References Cited

U.S. PATENT DOCUMENTS

| | | | | |
|---|---|---|---|---|
| 5,648,779 A | * | 7/1997 | Cabler ........................ | 341/143 |
| 5,727,023 A | * | 3/1998 | Dent .......................... | 375/244 |
| 5,751,615 A | * | 5/1998 | Brown ........................ | 708/313 |
| 6,069,535 A | * | 5/2000 | Khlat ......................... | 331/1 A |
| 6,081,219 A | | 6/2000 | Prasanna | |
| 6,097,251 A | * | 8/2000 | Khullar et al. .............. | 330/129 |
| 6,101,224 A | * | 8/2000 | Lindoff et al. .............. | 375/300 |
| 6,373,423 B1 | | 4/2002 | Knudsen | |
| 6,546,044 B1 | * | 4/2003 | Dent .......................... | 375/216 |

FOREIGN PATENT DOCUMENTS

EP   0729234 B1   8/1996

OTHER PUBLICATIONS

GB 0311992.2 Search Report, no date.

* cited by examiner

*Primary Examiner*—Jean Bruner Jeanglaude

(57) ABSTRACT

An analog to digital converter comprising a plurality of comparators arranged to periodically sample an analog signal; a calculator arranged to predict a change in signal magnitude of the analog signal between one sample of the analog signal and another sample of the analog signal based upon predetermined criteria of the analog signal; and a controller for varying an operational parameter of one or more of the comparators based upon the predicted change in the signal magnitude of the analog signal.

17 Claims, 5 Drawing Sheets

US 7,079,068 B2

ANALOG TO DIGITAL CONVERTER

FIELD OF INVENTION

The present invention relates to an analog to digital converter.

BACKGROUND

With the increasing demand for electronic devices to have reduced current consumption and to avoid the use of off-chip components there has been an increasing trend for electronic devices to perform processing in the digital domain.

Consequently, there has been an increasing demand for high resolution, low power, and inexpensive analog to digital converters ADC.

One type of ADC that is commonly used for analog to digital conversion is the over sampling ADC based upon sigma delta $\Sigma\Delta$ modulation. Over sampling ADC's use an over sampling ratio OSR that is the ratio of the sampling frequency of the sigma delta modulator to twice the bandwidth (Nyquist frequency) of the input signal. The over sampling ratio will be greater than one and will often be greater than a few tens. For conventional n-th order sigma delta modulators SDM, the signal to quantization noise ratio increases by n*6 dB+3 dB for each doubling of the OSR. Thus, better resolution is achieved by implementing a higher OSR.

The SDM is a multi-order modulator that is arranged to provide noise shaping, such that the quantization noise is small in the frequency band of interest and large elsewhere.

For applications that operate with a low bandwidth, for example 20 kHz, a simple SDM, for example a $2^{nd}$ order SDM, would be suitable for providing the required noise shaping.

However, more recently there has been a need to use ADC's in high bandwidth applications, such as cellular systems and wireless local area networks WLAN. Where, for example, a WCDMA handset can be required to operate with a bandwidth of the order of 2 MHz. For a low order SDM to provide the required analog to digital conversion for a high bandwidth signal, with the required noise shaping, a high OSR would be required that would not only be difficult to design but would also result in a high power consumption for the SDM.

However, it is possible for a SDM to provide the required noise shaping characteristics for high bandwidth applications with a reduced OSR by increasing the order of the SDM.

However, for the SDM to have the dynamic range required for high bandwidth applications it is desirable for the SDM to include or to be combined with an embedded parallel (i.e. flash) ADC having a 2 or more bit quantizer. However, the use of a high bit flash ADC can result in high power consumption. For example, the power dissipation for a 6 bit quantizer can correspond to approximately a quarter of the total SDM power dissipation.

It is desirable to improve this situation.

SUMMARY

In accordance with a first aspect of the present invention there is provided an analog to digital converter.

This provides the advantage of allowing operational parameters of ADC comparators to be dynamically varied based upon predicted variations to an input signal, thereby allowing the power consumption of the ADC to be reduced when a signal variation is predicted to be small.

In accordance with a second aspect of the present invention there is provided a method for converting an analog signal to a digital signal.

DESCRIPTION OF THE DRAWINGS

An embodiment of the invention will now be described, by way of example, with reference to the drawings, of which.

DETAILED DESCRIPTION

Figure 1:
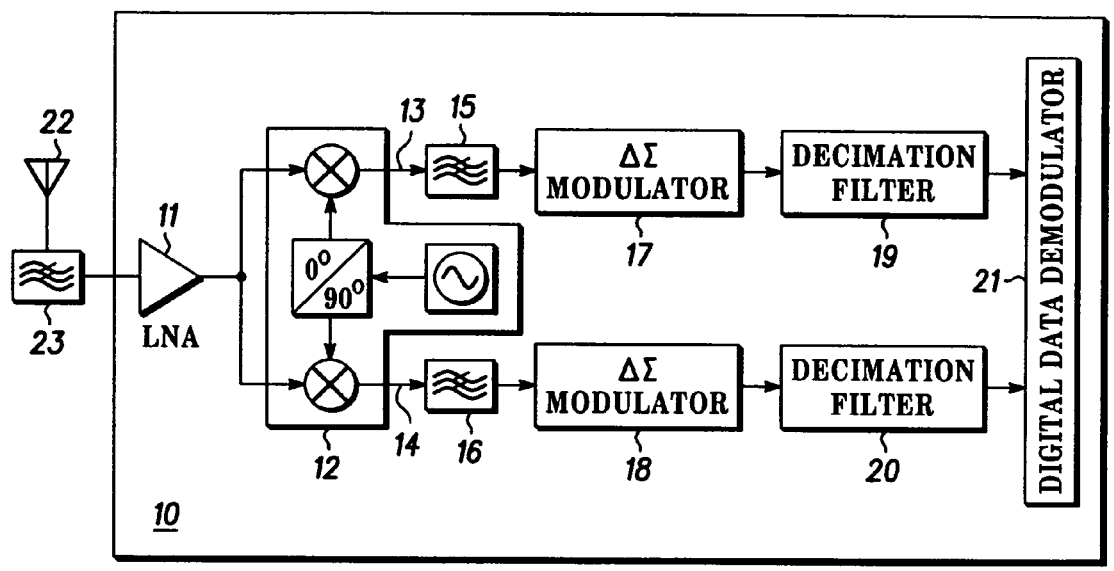
FIG. 1 illustrates a wireless receiver incorporating a sigma delta modulator according to an embodiment of the present invention.

FIG. 1 shows a simplified arrangement of a wireless receiver 10, for example for use in a radiotelephone or WLAN application.

The receiver 10 includes a low noise amplification section 11 coupled to a quadrature down conversion section 12. The quadrature down conversion section includes in-phase and quadrature baseband signal outputs 13, 14 that are coupled to respective anti-aliasing filters 15, 16. The respective anti-aliasing filter outputs are coupled to respective fourth order 6 bit sigma-delta modulators 17, 18, as described in detail below. The respective sigma-delta modulator outputs are coupled to respective decimator filters 19, 20, where the respective decimator filter outputs are coupled to a digital data modulator section 21.

The receiver 10 is coupled to an antenna 22 via a bandpass filter 23.

Figure 2:
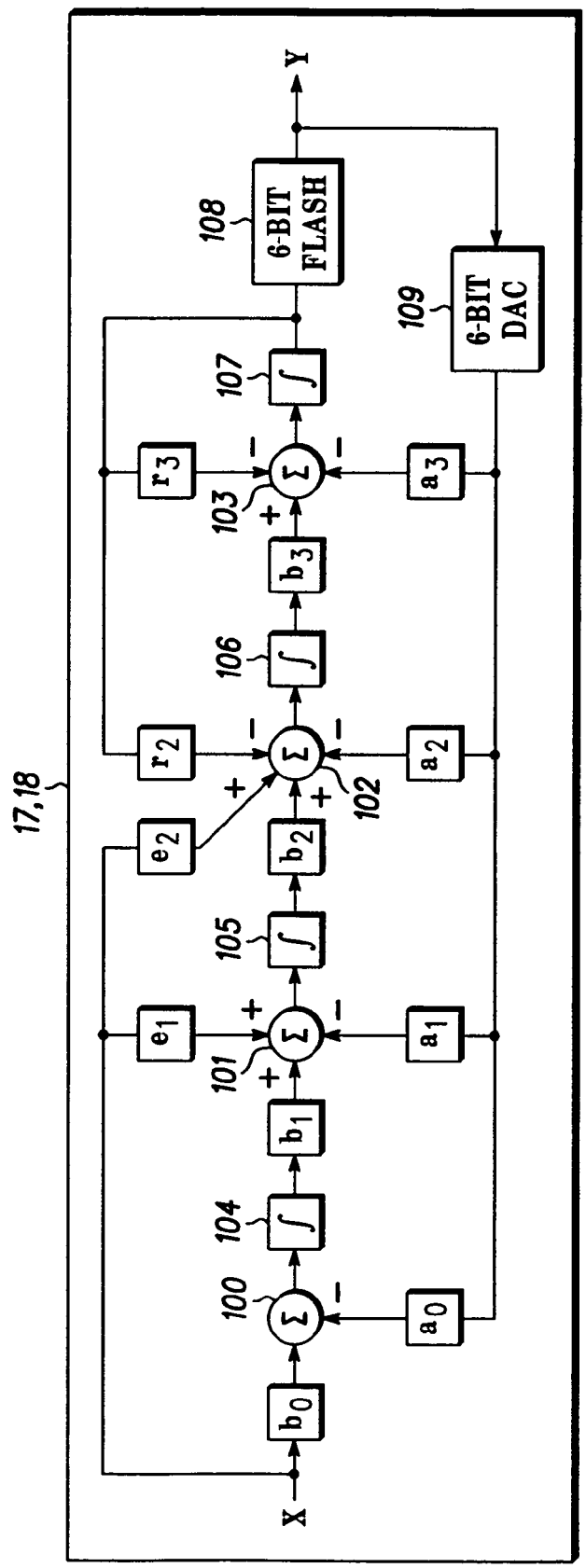
FIG. 2 illustrates a SDM according to an embodiment of the present invention.

FIG. 2 illustrates the fourth order 6 bit SDM 17, 18.

The SDM 17, 18 has a first summing node 100 having a first and second input and an output; a second summing node 101 having a first, second and third input and an output; a third summing node 102 having a first, second, third and fourth input and an output and a fourth summing node 103 having a first, second and third input and an output. The SDM 17, 18 additionally has a first, second, third and fourth integrator 104, 105, 106, 107, that act as integrating elements, a 6 bit quantiser 108 and a 6 bit DAC 109.

An analog signal is input to the first, second and third summing nodes 100, 101, 102 via respective gain coefficient elements $b_0$, $e_1$ and $e_2$. The output of the first summing node 100 is coupled to the input of the first integrator 104, while the output of the first integrator 104 is coupled to an input of the second summing node 101 via a gain coefficient element $b_1$. The output of the second summing node 101 is coupled to the input of the second integrator 105, while the output of the second integrator 105 is coupled to an input of the third summing node 102. The output of the third summing node 102 is coupled to the input of the third integrator 106, while the output of the third integrator 106 is coupled to the fourth summing node 103. The output of the fourth summing node 103 is coupled to the input of the fourth integrator 107, while the output of the fourth integrator 107, a noise shaped analog signal, is coupled to the input of the 6 bit quantiser 108 and is also feedback to an input of the third and fourth summing nodes 102, 103 via respective gain coefficient elements $r_2$ and $r_3$. The output of the 6 bit quantiser 108, a digital representation of the noise shaped analog signal, is coupled to the input of the decimator filter 19, 20 and to the input of the 6 bit DAC 109. The output of the 6 bit DAC 109 is feedback to an input of the first, second, third and fourth summing node 100, 101, 102, 103 via respective gain coefficient elements $a_0$, $a_1$, $a_2$ and $a_3$.

The first, second, third and fourth summing nodes 100, 101, 102, 103 and the first, second third and fourth integrators 104, 105, 106, 107, and the 6 bit DAC 109 and the gain coefficient elements a0, a1, $a_2$, $a_3$, $b_0$, $b_1$, $b_2$, $b_3$, $e_1$, $e_2$, $r_2$ and $r_3$ are arranged, as described above, to provide a fourth order SDM and provide an appropriate noise shaping function, as is well known to a person skilled in the art.

Figure 3:
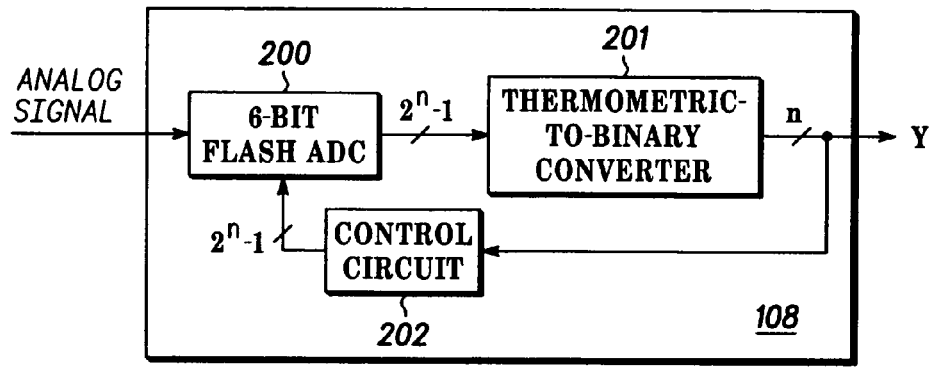
FIG. 3 illustrates a quantiser according to an embodiment of the present invention.

FIG. 3 illustrates the 6 bit flash quantiser 108.

The 6 bit quantiser 108 includes a 6 bit flash ADC 200, where the flash ADC 200 compares the input analog voltage to $2^6-1$ threshold voltages at periodic intervals to generate a digital representation of the analog signal. The periodic intervals are equal to the period of the over sampling frequency, itself determined by the OSR required to achieve the wanted resolution. In the SDM of FIG. 2 the over sampling frequency is 80 MHz and the sampling intervals equals 12.5 ns. The 6 bit flash ADC 200 performs the voltage comparison using $2^6-1$ comparators (not shown) (i.e. provides 63 quantization levels) where the dynamic range of the flash ADC 200 is dependent upon the bit size of the quantizer. The comparator outputs (i.e. a total of $2^6-1$ lines) of the 6 bit flash ADC 200 are coupled to a thermometric to binary converter, where the thermometric to binary converter 201 converts the $2^6-1$ digital input lines into a representative 6 bit digital word that forms the output of the quantiser 108. The 6 bit digital output of the thermometric to binary converter 201 is connected to both a control circuit 202, which forms part of the ADC, and the decimation filter 19, 20.

Figure 4:
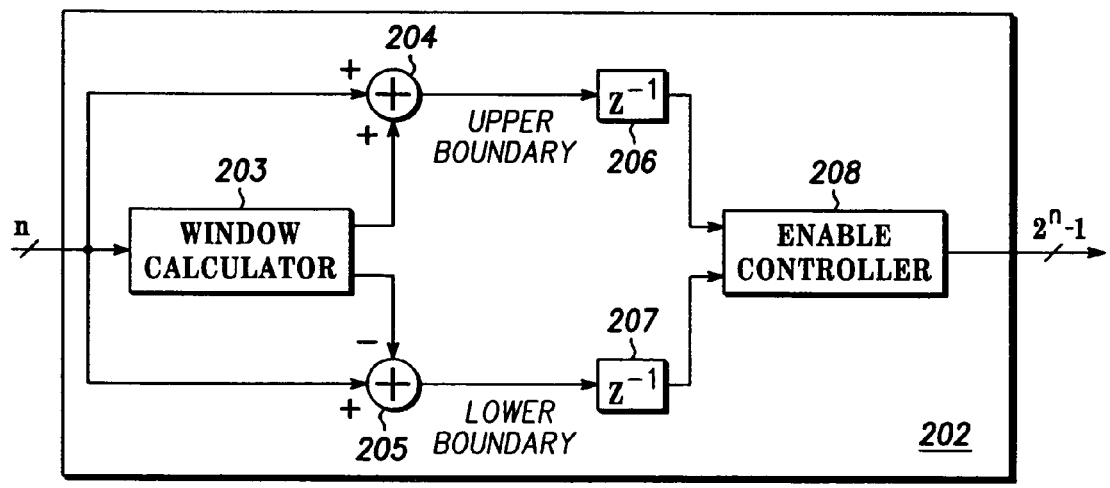
FIG. 4 illustrates a control circuit according to an embodiment of the present invention.

As shown in FIG. 4 the control circuit 202 includes a window circuit, a first summing node 204 having a first and second input and an output, a second summing node 205 having a first and second input and an output, a first and second latch 206, 207 and a feedback circuit having an enable controller 208.

The 6 bit digital output of the thermometric to binary converter 201 is connected to the first inputs of the first and second summing nodes 204, 205 and to an input of the window calculator 203. Additionally, outputs from the window calculator 203 are fed to the second inputs of the first and second summing nodes 204, 205. The outputs of the respective first and second summing nodes 204, 205 are coupled to the respective first and second latches 206, 207. The first and second latches 206, 207 are arranged to store a value of a digital sample value output from the respective first and second summing nodes 204, 205.

The window calculator 203 is arranged to store or calculate the predicted size of the variation window of the signal for the next sample of the analog signal using the value of the current sample and, if necessary, previous samples of the analog signal, in conjunction with predetermined criteria of the analog signal, as described below.

Half of the variation window as calculated by the window calculator 203 is decreased by one unit and provided to the second input of the first summing node 204, which adds the value to the current sample value and outputs the upper boundary value, which is stored in the first latch 206.

Half of the variation window as calculated by the window calculator 203 is decreased by one unit and provided to the second input of the second summing node 205, which subtracts the value from the current sample value outputs the lower boundary value, which is stored in the second latch 207.

Once the modified sample values have been stored in the respective first and second latches 206, 207 for the period of one sample the modified sample values are fed to the enable controller 208 that sends control signals to the flash ADC, for the next sample, to disable comparators that have a voltage threshold range outside the upper and lower boundary values, thereby avoiding unnecessary power consumption by not having comparators enabled that will not be needed.

The window calculator 203 determines the variation window according to the most suitable algorithm for the receiver that the SDM 17, 18 is embedded within. In the SDM 17, 18 of FIG. 3, the window calculator stores a pre-determined value that has been calculated according to the properties of the received signal, to the attenuation provided versus frequency by the anti-aliasing filter in front of the SDM, to the OSR and to the SDM Signal Transfer Function.

In the current example the variation window is calculated to be equal to 19 based upon the above criteria. As described above, this value is then stored in the window calculator 203 whatever the current sample value at the thermometric to binary converter output.

However, there might be some need for adapting the window size to the variation of the signal at the thermometric to binary converter output. Those skilled in the art of signal processing would understand that the adaptation may be done by doing some linear interpolation from the current and the previous samples, by doing some polynomial interpolation from the current and several previous samples or by using any algorithm suitable in the application of interest.

Figure 5:
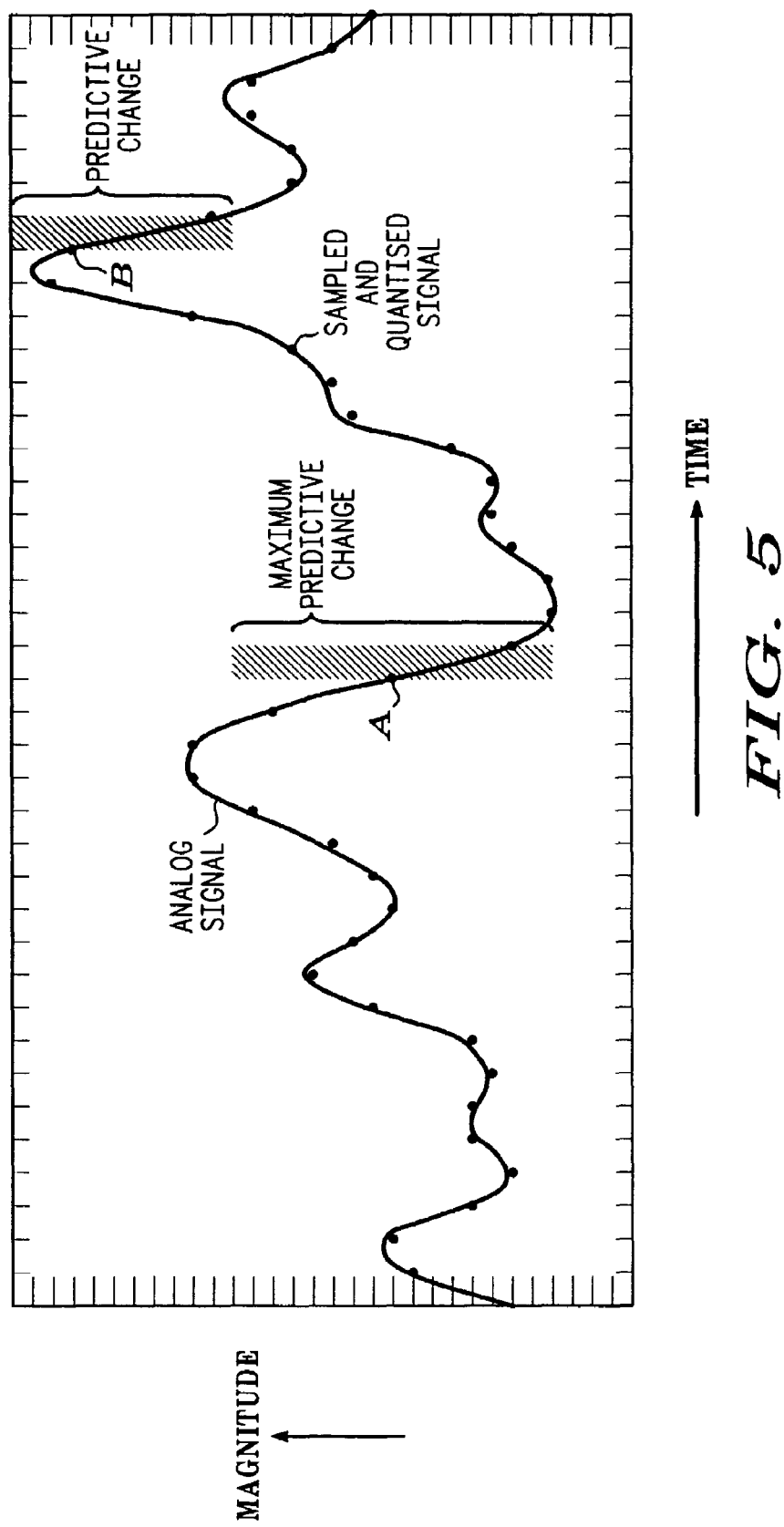
FIG. 5 shows a signal magnitude verses time graph illustrating signal variations between different samples.

By way of example, with reference to FIG. 5, which shows the quantization of an analog signal having 32 quantization levels, (i.e. 31 comparators) in the Y axis with time in the X axis, where the solid line represents the analog signal, and the dots represent the quantized values of the analog signal. The window calculator 203 stores a variation window of 17. Accordingly, the window calculator 203 provides the value of (17−1)/2=8 to both the first and second summing nodes 204, 205. For the quantised sample A the output of nodes 204 and 205 is used to enable comparators 4 to 20 (i.e. sample value of A minus one plus and minus 8) for the next sample, where a sample value of 7 is actually measured.

For the quantized sample B the output of nodes 204 and 205 is used to enable comparators 20 to 31 (i.e. sample value of B minus one plus 3 and minus 8) for the next sample, where a sample value of 29 is actually measured. It may be noticed that 8 comparators instead of 3 should have been enabled above the value of the current sample according to a generic rule of the present invention. However, as there are no comparators beyond the comparator number 31 no more than 3 comparators can be enabled in this particular case. This aspect is taken into account by the enabling controller 208.

The window calculator 203, which in this embodiment may only need to be a few gates, calculates a predicted variation in sample value based upon well bounded characteristics associated with a SDM processed signal, for example the definition of the SDM input range; by the anti-alias filtering used in front of the SDM; by the OSR; and by the SDM signal transfer function.

Figure 6:
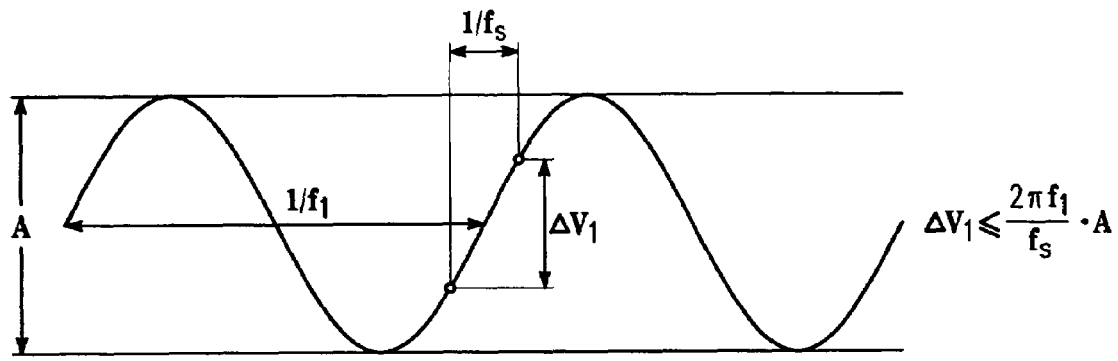
FIG. 6 illustrates an input signal to an ADC

By way of simple illustration using a sin wave, as shown in FIG. 6, it can be seen that for a sin wave having a maximum amplitude A and maximum frequency $f_1$ that with a sample frequency $f_s$ it can be determined that the maximum variation in signal magnitude from one sample to another is going to be equal or less than:

$$2\pi f_1 A/f_s.$$

This corresponds to the derivation of the sine function around zero as it is well known that this is where the derivation of such a function is a maximum (i.e. where the variation of the sine function is maximum). Interpolating the derivative over the duration of one sample (i.e. sample interval) yields the above maximum variation.

Additionally, or alternatively, as stated above, the window calculator 203 could be arranged to use other types of interpolation, for example a predictive algorithm.

Figure 7:
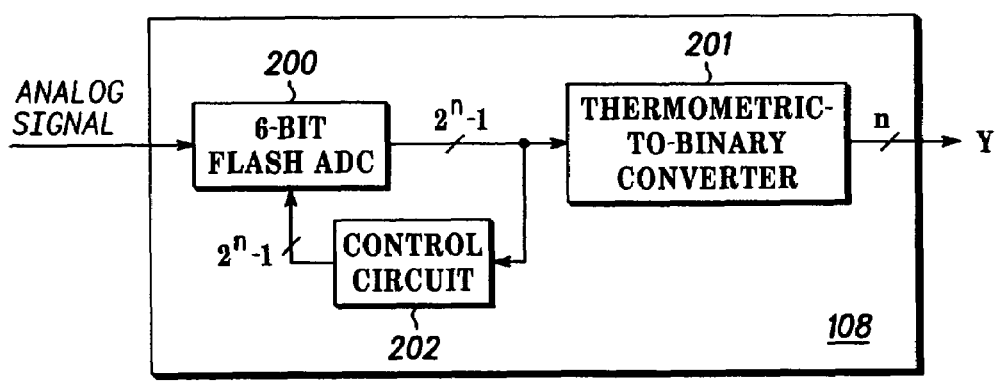
FIG. 7 illustrates an alternative embodiment of a quantiser according to an embodiment of the present invention.

FIG. 7 illustrates an alternative embodiment, where the output of the 6 bit flash ADC 200 is provided directly to the control circuit 202. The control circuit 202 in this embodiment operates as described above.

In another alternative embodiment, rather than disabling comparators based upon a predicted variation in signal magnitude, the quantiser 108 could be arranged such that the voltage threshold for the comparators of the flash ADC could be changed based upon the control signal provided by the feedback circuit. Such that a reduced number of comparators could be used that are all enabled such that for a small predicted change in sample value the voltage threshold for the comparators could be lowered, however, for a large predicted change in sample value the voltage threshold for the comparators could be increased.

It will be apparent to those skilled in the art that the disclosed subject matter may be modified in numerous ways and may assume may embodiments other than the preferred form specifically set out as described above, for example the ADC of the present invention could be used in applications other than a radiotelephone and a WLAN such as video signal processing, medical imaging and radar detection systems, the ADC could be used in a sigma-delta modulator other than fourth order sigma-delta modulator, an ADC according to the present invention does not need to be a 6 bit ADC, the window calculator could be implement in alternative ways, for example a digital signal processor.

The invention claimed is:

1. A sigma-delta modulator incorporating a sigma-delta modulation loop and an analog to digital converter comprising a plurality of comparators arranged to periodically sample an analog signal; a calculator arranged to predict a change in signal magnitude of the analog signal between one sample of the analog signal and another sample of the analog signal based upon: the current sample of the analog signal, previous samples of the analog signal in conjunction with predetermined criteria of the analog signal; and a feedback control loop comprising a controller for varying an operational parameter of one or more of the comparators based upon the predicted change in the signal magnitude of the analog signal, wherein the predetermined criteria is based upon an over sampling ratio of the sigma-delta modulator.

2. A sigma-delta modulator according to claim 1, wherein the operational parameter is the enabling of a set of the one or more comparators, wherein the set of comparators define a quantization level.

3. A sigma-delta modulator according to claim 2, wherein the quantization level corresponds to a signal magnitude equal or greater to the predicted change.

4. A sigma-delta modulator according to claim 1, wherein the operational parameter is the setting of a voltage threshold for each of the one or more comparators, wherein the voltage threshold for each of the one or more comparators is associated with the predicted change.

5. A sigma-delta modulator according to claim 1, wherein the calculator incorporates a predictive algorithm to predict the change in signal magnitude of the analog signal.

6. A sigma-delta modulator according to claim 1, wherein the sigma-delta modulator is a fourth order sigma-delta modulator.

7. A sigma-delta modulator according to claim 1, wherein the calculator is arranged to predict the change in signal magnitude of the analog signal by calculating the maximum variation in signal magnitude that could occur within the boundaries defined by the predetermined criteria.

8. A sigma-delta modulator according to claim 7, wherein the maximum variation is arranged to define the quantization level by adding and subtracting half the maximum variation to a current sample value.

9. A radiotelephone incorporating a sigma-delta modulator according to claim 1.

10. A sigma-delta modulator according to claim 1, wherein the predetermined criteria is based upon characteristics of an anti-alias filter associated wit the sigma-delta modulator.

11. A sigma-delta modulator according to claim 1, wherein the predetermined criteria is based upon the sigma-delta modulator signal transfer function.

12. A method for converting an analog signal to a digital signal in a sigma-delta modulator incorporating a sigma-delta modulation loop and an analog to digital converter, the method comprising periodically sampling an analog signal with a plurality of comparators; predicting a change in signal magnitude of the analog signal between one sample of the analog signal and another sample of the analog signal based upon the current sample of the analog signal, previous samples of the analog signal in conjunction with predetermined criteria of the analog signal; varying an operational parameter of one or more of the comparators based upon the predicted change in the signal magnitude of the analog signal via a feedback control loop, wherein the predetermined criteria is based upon an over sampling ratio of the sigma-delta modulator.

13. A method for converting an analog signal to a digital signal in a sigma-delta modulator according to claim 12, wherein the predetermined criteria is based upon the sigma-delta modulator signal transfer function.

14. A method for converting an analog signal to a digital signal in a sigma-delta modulator according to claim 12, wherein the operational parameter is the enabling of a set of the one or more comparators, wherein the set of comparators define a quantization level.

15. A method for converting an analog signal to a digital signal in a sigma-delta modulator according to claim 12, wherein the quantization level corresponds to a signal magnitude equal or greater to the predicted change.

16. A method for converting an analog signal to a digital signal in a sigma-delta modulator according to claim 12, wherein the operational parameter is the setting of a voltage threshold for each of the one or more comparators, wherein the voltage threshold for each of the one or more comparators is associated with the predicted change.

17. A method for converting an analog signal to a digital signal in a sigma-delta modulator according to claim 12, wherein the predetermined criteria is based upon characteristics of an anti-alias filter associated with the sigma-delta modulator.

* * * * *

UNITED STATES PATENT AND TRADEMARK OFFICE
CERTIFICATE OF CORRECTION

| | | |
|---|---|---|
| PATENT NO. | : 7,079,068 B2 | Page 1 of 1 |
| APPLICATION NO. | : 10/851608 | |
| DATED | : July 18, 2006 | |
| INVENTOR(S) | : Patrick Clement | |

It is certified that error appears in the above-identified patent and that said Letters Patent is hereby corrected as shown below:

In Column 6, Line 31, Claim No. 10:

Change "of an anti-alias filter associated wit the sigma-delta" to --of an anti-alias filter associated with the sigma-delta--

Signed and Sealed this

Third Day of June, 2008

JON W. DUDAS
*Director of the United States Patent and Trademark Office*